(12) United States Patent
Lee et al.

(10) Patent No.: US 12,288,588 B2
(45) Date of Patent: Apr. 29, 2025

(54) MEMORY, MEMORY SYSTEM AND OPERATION METHOD OF MEMORY

(71) Applicant: SK hynix Inc., Gyeonggi-do (KR)

(72) Inventors: Kyo Yun Lee, Gyeonggi-do (KR); Sang Jin Byeon, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 63 days.

(21) Appl. No.: 17/994,109

(22) Filed: Nov. 25, 2022

(65) Prior Publication Data

US 2024/0021260 A1    Jan. 18, 2024

(30) Foreign Application Priority Data

Jul. 12, 2022    (KR) .................. 10-2022-0085750

(51) Int. Cl.
*G11C 29/08* (2006.01)
*G11C 11/406* (2006.01)
*G11C 11/408* (2006.01)
*G11C 11/4096* (2006.01)

(52) U.S. Cl.
CPC ............ *G11C 29/08* (2013.01); *G11C 11/406* (2013.01); *G11C 11/408* (2013.01); *G11C 11/4096* (2013.01)

(58) Field of Classification Search
CPC .......... G11C 2211/4062; G11C 11/406; G11C 11/4096; G11C 11/40622; G11C 11/40618; G11C 11/40607; G11C 2211/4067; G11C 11/4085; G11C 11/4087; G11C 11/408

See application file for complete search history.

(56) References Cited

U.S. PATENT DOCUMENTS

| | | | |
|---|---|---|---|
| 10,810,079 B2 | 10/2020 | Halbert et al. | |
| 10,817,371 B2 | 10/2020 | Rooney et al. | |
| 2019/0333566 A1* | 10/2019 | Kim | G11C 11/4096 |
| 2021/0142860 A1* | 5/2021 | Song | G11C 29/44 |
| 2021/0286670 A1* | 9/2021 | Rooney | G11C 11/4087 |
| 2022/0093169 A1* | 3/2022 | Asami | G11C 16/10 |
| 2023/0126944 A1* | 4/2023 | Mirichigni | G11C 11/4085 365/230.06 |
| 2023/0141789 A1* | 5/2023 | Cho | G11C 11/4093 365/222 |

FOREIGN PATENT DOCUMENTS

KR    10-2021-0110188 A    9/2021

* cited by examiner

*Primary Examiner* — Thien Nguyen
(74) *Attorney, Agent, or Firm* — IP & T GROUP LLP (57) ABSTRACT

A method for operating a memory includes: receiving a predetermined command; performing an error check operation on a selected row and selected columns of one memory bank among a plurality of memory banks in response to the predetermined command; and performing a refresh operation on a selected row of each of the other memory banks among the memory banks in response to the predetermined command.

24 Claims, 5 Drawing Sheets

MEMORY, MEMORY SYSTEM AND OPERATION METHOD OF MEMORY

CROSS-REFERENCE TO RELATED APPLICATIONS

The present application claims priority of Korean Patent Application No. 10-2022-0085750, filed on Jul. 12, 2022, which is incorporated herein by reference in its entirety.

BACKGROUND

1. Field

Various embodiments of the present invention relate to a memory.

2. Description of the Related Art

In the early stage of a semiconductor memory device industry, there were many originally good dies on the wafers, which means that memory chips were produced with no defective memory cells through a semiconductor fabrication process. However, as the capacity of memory devices increases, it becomes difficult to fabricate a memory device that does not have any defective memory cell, and nowadays, it may be said that there are substantially no chances that a memory device is fabricated without any defective memory cells. To address the issue, a repair method of including redundant memory cells in a memory device and replacing defective memory cells with the redundant memory cells is being used.

As another method, an error correction circuit (ECC) for correcting errors in a memory system is used to correct errors occurring in memory cells and errors occurring when data are transferred during a read operation and a write operation of the memory system.

SUMMARY

Embodiments of the present invention are directed to an error checking technique for a memory.

In accordance with an embodiment of the present invention, a method for operating a memory includes: receiving a predetermined command; performing an error check operation on a selected row and selected columns of one memory bank among a plurality of memory banks in response to the predetermined command; and performing a refresh operation on a selected row of each of the other memory banks among the memory banks in response to the predetermined command.

In accordance with another embodiment of the present invention, a memory includes: a plurality of memory banks; an error correction circuit; and a control signal generating circuit suitable for generating, in response to a predetermined command, internal control signals to perform an error check operation in which the error correction circuit checks for an error in one memory bank among the memory banks, and to perform a refresh operation on the other memory banks among the memory banks.

In accordance with yet another embodiment of the present invention, a memory system includes: a memory including a plurality of memory banks and suitable for performing an error check operation on one memory bank among the memory banks and performing a refresh operation on the other memory banks among the memory banks, in response to application of a predetermined command; and a memory controller suitable for controlling the memory and applying the predetermined command to the memory.

DETAILED DESCRIPTION

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout this disclosure, like reference numerals refer to like parts throughout the various figures and embodiments of the present invention.

Figure 1:
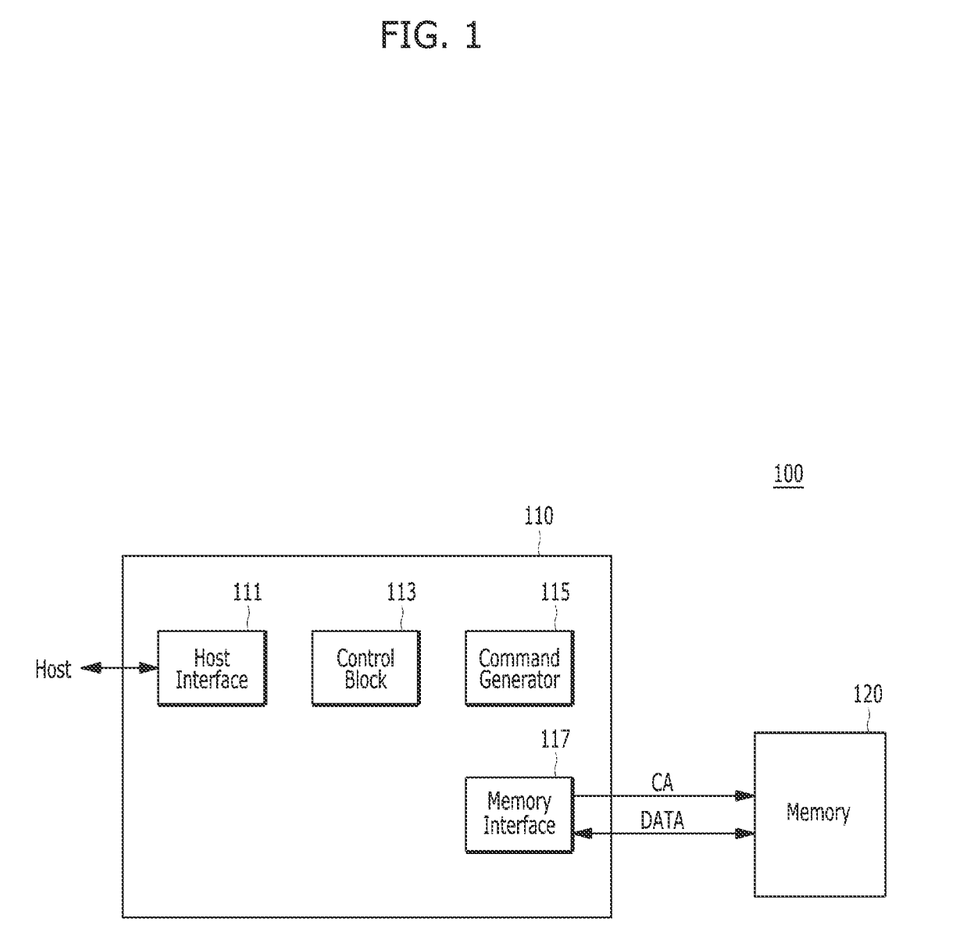
FIG. 1 is a block diagram illustrating a memory system in accordance with an embodiment of the present invention.

FIG. 1 is a block diagram illustrating a memory system 100 in accordance with an embodiment of the present invention.

The memory controller 110 may control the operation of the memory 120 according to a request of the host HOST. The host HOST may include a Central Processing Unit (CPU), a Graphic Processing Unit (GPU), an Application Processor (AP), and the like. The memory controller 110 may include a host interface 111, a control block 113, a command generator 115, and a memory interface 117. The memory controller 110 may be included in a CPU, GPU, or AP. In this case, the host HOST may mean a structure other than the memory controller 110 in the CPU, GPU, or AP. For example, when the memory controller 110 is included in a CPU, the host HOST of the figure may represent the other constituent elements except for the memory controller 110 in the CPU.

The host interface 111 may be an interface for communication between the host HOST and the memory controller 110.

The control block 113 may control the overall operation of the memory controller 110 and schedule an operation to be commanded to the memory 220. In order to improve the performance of the memory 120, the control block 113 may change the order that requests are received from the host HOST and the order of operations to be commanded to the memory 120. For example, even though the host HOST requests the memory 120 to perform a read operation first and then to perform a write operation, the order may be changed so that the write operation is performed prior to the read operation.

The command generator 115 may generate a command to be applied to the memory 120 according to the order of the operations determined by the control block 113.

The memory interface 117 may be an interface between the memory controller 110 and the memory 120. A command and an address CA may be transferred from the memory controller 110 to the memory 120 through the memory interface 117, and data DATA may be transferred/received between the memory controller 110 and the memory 120 through the memory interface 117. The memory interface 117 is also referred to as a PHY interface.

The memory 120 may perform an operation commanded by the memory controller 110. The memory 120 will be described in detail with reference to FIG. 2.

Figure 2:
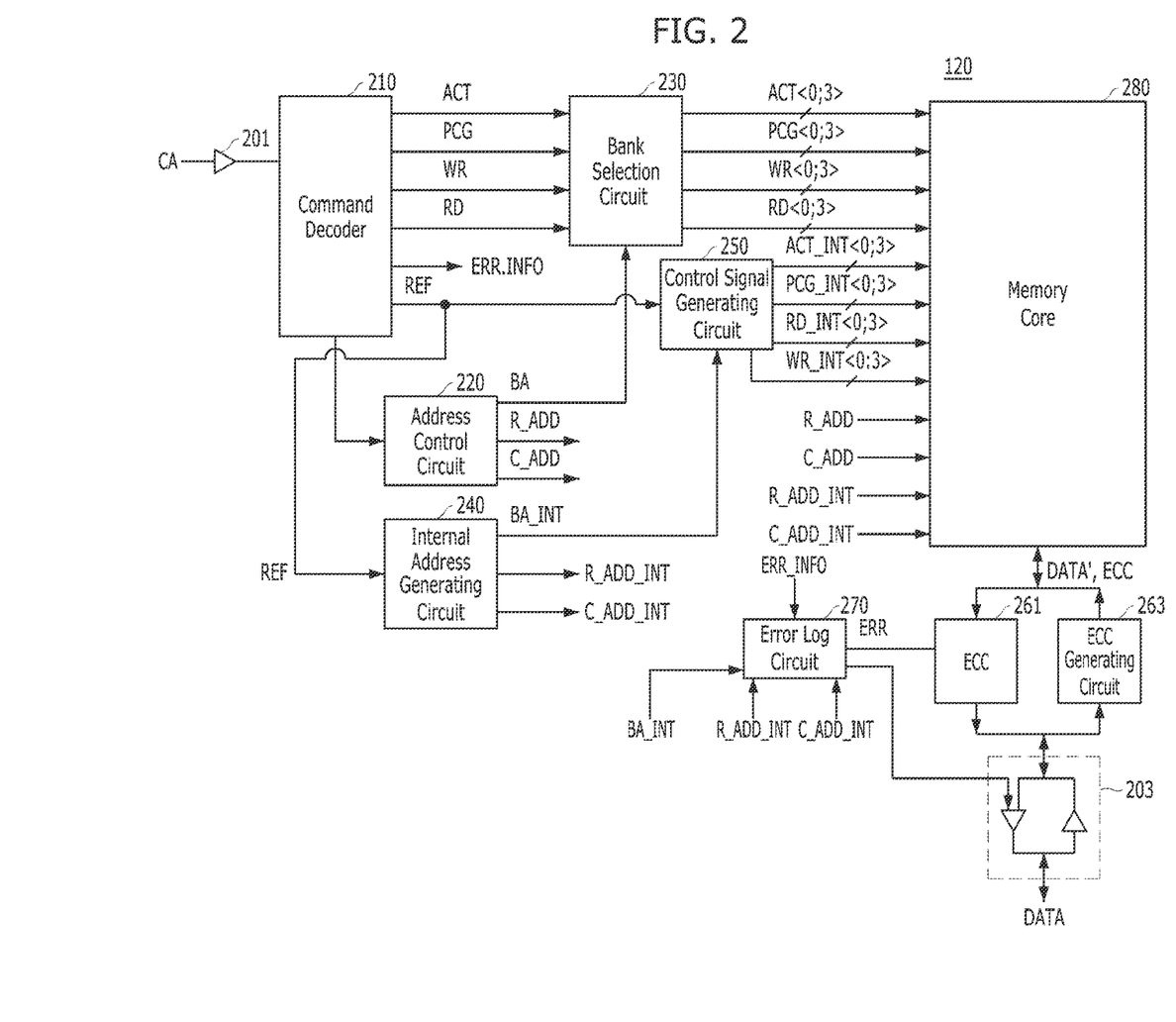
FIG. 2 is a block diagram illustrating a memory in accordance with an embodiment of the present invention.
Figure 3:
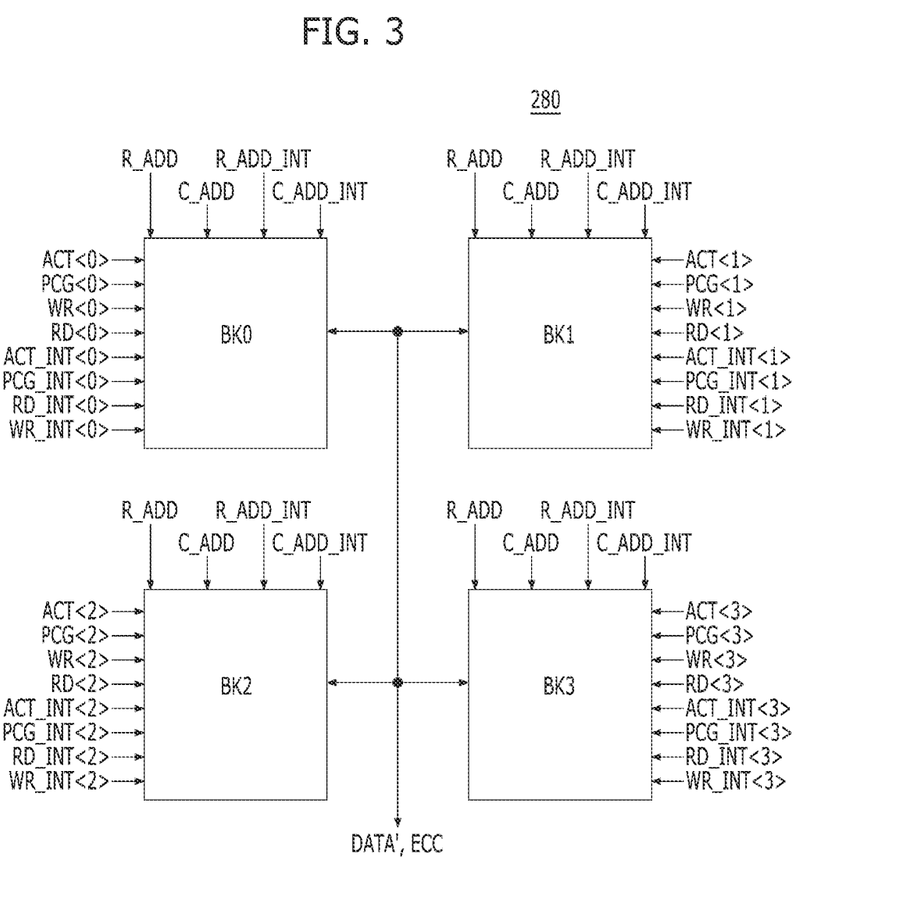
FIG. 3 is a block diagram illustrating a memory core of the memory in accordance with an embodiment of the present invention.

FIG. 2 is a block diagram illustrating the memory 120 in accordance with an embodiment of the present invention. FIG. 3 is a block diagram illustrating a memory core 280 of the memory 120 in accordance with an embodiment of the present invention.

Referring to FIG. 2, the memory 120 may include a command address receiving circuit 201, a data transferring/receiving circuit 203, a command decoder 210, an address control circuit 220, a bank selection circuit 230, an internal address generating circuit 240, a control signal generating circuit 250, an error correction circuit 261, an error correction code generating circuit 263, an error log circuit 270, and a memory core 280.

The command address receiving circuit 201 may receive a command and an address CA. Depending on the type of the memory 120, a command and an address may be input to the same input terminals, or a command and an address may be input to separate input terminals. Herein, it is illustrated that the command and the address are input to the same terminals. The command and the address CA may be multiple bits.

The data transferring/receiving circuit 203 may receive data DATA or transfer data DATA. The data transferring/receiving circuit 203 may receive data DATA to be written into the memory core 270 during a write operation, and may receive data DATA read from the memory core 270 during a read operation.

The command decoder 210 may determine the type of operation which is commanded by the memory controller 110 to the memory 120 by decoding the command and the address CA. An active signal ACT may be a signal which is activated when an active operation is commanded, and a precharge signal PCG may be a signal which is activated when a precharge operation is commanded. A refresh signal REF may be a signal which is activated when a refresh operation is commanded. Also, a write signal WR may be a signal which is activated when a write operation is commanded, and a read signal RD may be a signal which is activated when a read operation is commanded. Also, an error information signal ERR_INFO may be a signal which is activated when there is a request for error information.

The address control circuit 220 may classify the address received from the command decoder 210 as a bank address BA, a row address R_ADD, and a column address C_ADD. The bank address BA may be an address for selecting one memory bank among the memory banks BK0 to BK3 of the memory core 280. The row address R_ADD may be an address for selecting one row among the rows in the memory bank. The column address C_ADD may be an address for selecting columns on which a read operation or a write operation is to be performed in the memory bank. Each of the addresses BA, R_ADD, and C_ADD may be multiple bits.

The bank selection circuit 230 may decode the bank address BA and select a memory bank on which an operation commanded by the signals ACT, PCG, RD, and WT is to be performed among the memory banks BK0 to BK3. When the active signal ACT is activated, the bank selection circuit 230 may activate an active signal of the memory bank which is selected based on the bank address BA among the active signals ACT<0:3>. When the precharge signal PCG is activated, the bank selection circuit 230 may activate a precharge signal of the memory bank which is selected based on the bank address BA among the precharge signals PCG <0:3>. Also, when the write signal WR is activated, the bank selection circuit 230 may activate a precharge signal of the memory bank which is selected based on the bank address BA among the precharge signals PCG <0:3>. When the read signal RD is activated, the bank selection circuit 230 may activate a read signal of the memory bank which is selected based on the bank address BA among the read signals RD<0:3>. For example, when the active signal ACT is activated and the memory bank BK2 is selected based on the bank address BA, the bank selection circuit 230 may activate an active signal ACT<2> of the memory bank BK2. Similarly, when the read signal RD is activated and the memory bank BK1 is selected based on the bank address BA, the bank selection circuit 230 may activate a read signal RD<1> of the memory bank BK1.

The internal address generating circuit 240 may generate an internal bank address BA_INT, an internal row address R_ADD_INT, and an internal column address C_ADD_INT to be used for a refresh operation and an error check operation. During the refresh operation and the error check operation, the internal addresses BA_INT, R_ADD_INT, and C_ADD_INT that are generated by the internal address generating circuit 240 in the inside of the memory 120 may be used rather than the addresses BA, R_ADD, and C_ADD that are input from the outside of the memory 120. The internal address generating circuit 240 may change the internal addresses BA_INT, R_ADD_INT, and C_ADD_INT in response to a refresh command which is applied to the memory 120, that is, in response to the activation of the refresh signal REF. To be specific, the internal address generating circuit 240 may change the internal row address R_ADD_INT by one step whenever the refresh signal REF is activated, change the internal column address C_ADD_INT by one step whenever the internal row address R_ADD_INT is cycled by 1 cycle, and change the internal bank address BA_INT by one step whenever the internal column address C_ADD_INT is cycled once.

For the sake of convenience in description, the value of the internal bank address BA_INT ranges from 0 to 3, and the value of the internal row address R_ADD_INT ranges from 0 to 3, and the value of the internal column address C_ADD_INT ranges from 0 to 3. In this case, whenever the refresh signal REF is activated, the internal address generating circuit 240 may generate the internal addresses BA_INT, R_ADD_INT, and C_ADD_INT in the order of (0, 0, 0)→(0, 1, 0)→(0, 2, 0)→(0, 3, 0)→(0, 0, 1)→(0, 1, 1)→(0, 2, 1)→(0, 3, 1)→(0, 0, 2)→(0, 1, 2)→(0, 2, 2)→(0, 3, 2)→(0, 0, 3)→(0, 1, 3)→(0, 2, 3)→(0, 3, 3)→(1, 0, 0)→(1, 1, 0)→(1, 2, 0)→(1, 3, 0)→(1, 0, 1)→(1, 1, 1)→(1, 2, 1)→(1, 3, 1)→(1, 0, 2)→(1, 1, 2)→(1, 2, 2)→(1, 3, 2)→(1, 0, 3)→(1, 1, 3)→(1, 2, 3)→(1, 3, 3)→(2, 0, 0)→(2, 1, 0)→(2, 2, 0)→(2, 3, 0)→(2, 0, 1)→(2, 1, 1)→(2, 2, 1)→(2, 3, 1)→(2, 0, 2)→(2, 1, 2)→(2, 2, 2)→(2, 3, 2)→(2, 0, 3)→(2, 1, 3)→(2, 2, 3)→(2, 3, 3)→(3, 0, 0)→(3, 1, 0)→(3, 2, 0)→(3, 3, 0)→(3, 0, 1)→(3, 1, 1)→(3, 2, 1)→(3, 3, 1)→(3, 0, 2)→(3, 1, 2)→(3, 2, 2)→(3, 3, 2)→(3, 0, 3)→(3, 1, 3)→(3, 2, 3)→(3, 3, 3).

As another example, the internal address generating circuit 240 may change the internal row address R_ADD_INT by one step whenever the refresh signal REF is activated, and change the internal bank address BA_INT by one step whenever the internal row address R_ADD_INT is cycled once, and change the internal column address by one step whenever the internal bank address BA_INT is cycled once. In this case, the order of BA_INT, R_ADD_INT, and C_ADD_INT may be changed to C_ADD_INT, R_ADD_INT, and BA_INT in the example of changing the internal addresses shown above.

The control signal generating circuit 250 may generate the control signals ACT_INT<0:3>, PCG_INT<0:3>, RD_INT<0:3>, and WR_INT<0:3> to perform an error check operation in the memory bank selected based on the internal bank address BA_INT among the memory banks BK0 to BK3 in response to the application of the refresh command, that is, in response to the activation of the refresh signal REF, and to perform a refresh operation on the other memory banks. The error check operation may also be referred to as an ECS (Error Check and Scrub) operation, and it may refer to an operation of reading data from a target memory bank and selecting an area with many errors by checking the data for errors in the error correction circuit 261.

The control signal generating circuit 250 may activate the internal active signals ACT_INT<0:3> of the memory banks BK0 to BK3 in response to the activation of the refresh signal REF, activate the internal read signal (e.g., RD_INT<2>) of the memory bank (e.g., BK2) which is selected based on the internal bank address BA_INT among the memory banks after the activation of the internal active signals ACT_INT<0:3>, and activate the internal precharge signals PCG<0:3> of the memory banks BK0 to BK3 after the internal read signal (e.g., RD_INT<2>) is activated. Accordingly, an error check operation including an active operation, a read operation, and a precharge operation may be performed on the memory bank which is selected based on the internal bank address BA_INT, and a refresh operation including an active operation and a precharge operation may be performed on the other memory banks.

The error check operation may be performed including an active operation, a read operation, and a precharge operation. It may further include a write operation according to an embodiment of the present invention. That is, the error check operation may include an active operation, a read operation, a write operation (an operation of rewriting data corrected during a read process), and a precharge operation. In this case, the control signal generating circuit 250 may activate the internal active signals ACT_INT<0:3> of the memory banks BK0 to BK3 in response to the activation of the refresh signal REF, activate the internal read signal (e.g., RD_INT<2>) of the memory bank (e.g., BK2) which is selected based on the internal bank address BA_INT among the memory banks after the activation of the internal active signals ACT_INT<0:3>, activate the internal write signal (e.g., WR_INT<2>) of the selected memory bank (e.g., BK2) after the activation of the internal read signal (e.g., RD_INT<2>), and activate the internal precharge signals PCG<0:3> of the memory banks BK0 to BK3 after the activation of the internal write signal (e.g., WR_INT<2>).

The error correction circuit 261 may correct an error of data DATA' that is read based on an error correction code ECC which is read from a memory bank on which a read operation is performed among the memory banks BK0 to BK3 of the memory core 280. Herein, correcting an error may mean detecting an error in the data DATA' and correcting the detected error in the data DATA'. The error correction circuit 261 may detect and correct an error in the error correction code ECC as well as an error in the data DATA'. When an error in the data DATA' is detected and the detected error is corrected, data input to the error correction circuit 261 and data DATA output from the error correction circuit 261 may be different from each other. An error signal ERR may be a signal which is activated when an error is detected by the error correction circuit 261.

The error correction code generating circuit 263 may generate an error correction code ECC based on data during a write operation. During the write operation, only the error correction code ECC may be generated based on the data DATA, and an error of the data DATA may not be corrected. Therefore, the data DATA input to the error correction code generating circuit 263 and the data DATA output from the error correction code generating circuit 263 may be the same.

The error log circuit 270 may log an error which is detected during an error check operation, To be specific, the error log circuit 270 may classify and store a bad area based on the error detected during an error check operation. For example, the error log circuit 270 may count the number of errors for each row of the memory banks BK0 to BK3, and classify and store a row whose number of errors exceeds a threshold value among the rows of the memory banks BK0 to BK3 as bad areas. Since the error log circuit 270 receives the internal addresses BA_INT, R_ADD_INT, and C_ADD_INT and the error signal ERR, it is possible to check in which region of which memory bank of the memory core 280 an error is detected. When there is a request for error information from the memory controller 110, that is, when an error information signal ERR_INFO is activated, the error information logged in the error log circuit 270, that is, bad area information, may be transferred to the memory controller 110 through the data transferring/receiving the circuit 203.

The memory core 280 may include a plurality of memory banks BK0 to BK3, as shown in FIG. 2. Each of the memory banks BK0 to BK3 may include a cell array including memory cells that are arranged in a plurality of rows and a plurality of columns, a row decoder for activating/deactivating a row of the cell array, a column decoder for inputting/outputting data to/from the cell array, and constituent elements for performing such operations as active, precharge, read, and write operations, such as an input/output circuit.

The memory banks BK0 to BK3 may perform an active operation of activating a row which is selected based on the row address R_ADD among their own rows when an active signal corresponding thereto among the active signal ACT<0:3> is activated. Also, the memory banks BK0 to BK3 may perform a precharge operation of deactivating an activated row when a precharge signal corresponding thereto among the precharge signals PCG<0:3> is activated. The memory banks BK0 to BK3 may perform a write operation of writing data DATA' and an error correction code ECC into the memory cells of the columns that are selected based on the column address C_ADD in the activated row when a write signal corresponding thereto among the write signals WR<0:3> is activated. Also, the memory banks BK0 to BK3 may perform a read operation of reading the data DATA' and the error correction code ECC from the memory cells of the columns that are selected based on the column address C_ADD in the activated row when a read signal corresponding thereto among the read signals RD<0:3> is activated.

Also, the memory banks BK0 to BK3 may perform an active operation of activating a row which is selected based on the internal row address R_ADD_INT among their rows when an internal active signal corresponding thereto among the internal active signals ACT_INT<0:3> is activated. Also, the memory banks BK0 to BK3 may perform a precharge operation of deactivating an activated row when an internal precharge signal corresponding thereto among the internal precharge signals PCG_INT<0:3> is activated. Also, the memory banks BK0 to BK3 may perform a read operation of reading the data DATA' and the error correction code ECC from the memory cells of the columns that are selected based on the column address C_ADD_INT in the activated row when an internal read signal corresponding thereto among the internal read signals RD_INT<0:3> is activated. Also, the memory banks BK0 to BK3 may perform a write operation of writing data DATA' and an error correction code ECC into the memory cells of the columns that are selected based on the column address C_ADD_INT in the activated row when an internal write signal corresponding thereto among the internal write signals WR_INT<0:3> is activated.

Figure 4:
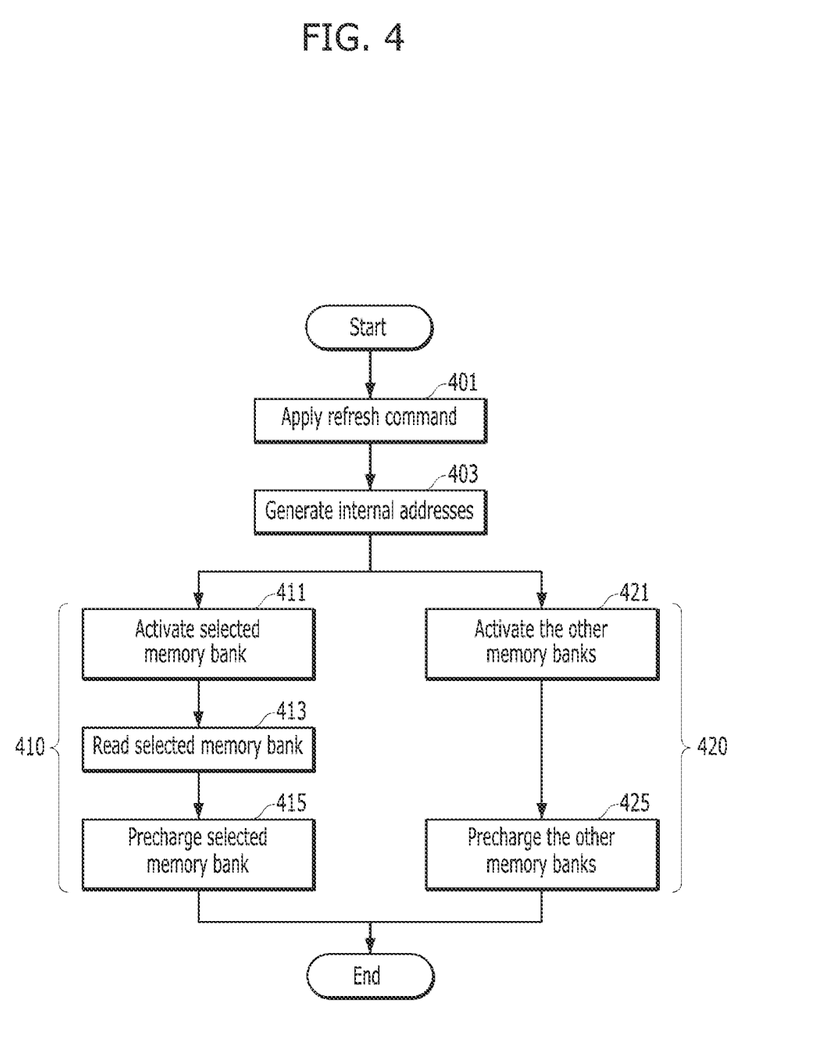
FIG. 4 is a flowchart describing an operation of the memory system shown in FIG. 1 in accordance with an embodiment of the present invention.

FIG. 4 is a flowchart describing an operation of the memory system 100 shown in FIG. 1 in accordance with an embodiment of the present invention.

Referring to FIG. 4, the memory controller 110 may apply a refresh command to the memory 120 in operation 401. The command decoder 210 of the memory 120 may activate the refresh signal REF.

The internal address generating circuit 240 may generate internal addresses BA_INT, R_ADD_INT, and C_ADD_INT to be used for a refresh operation and an error check operation in operation 403. The internal addresses BA_INT, R_ADD_INT, and C_ADD_INT generated by the internal address generating circuit 240 may be changed in response to the refresh signal REF.

Now, an error check operation of operation 410 may be performed in the memory bank which is selected based on the internal bank address BA_INT among the memory banks BK0 to BK3 of the memory core 280 due to the control signals generated by the control signal generating circuit 250, and a refresh operation of operation 420 may be performed on the other memory banks. Hereinafter, the memory bank BK1 is selected based on the internal bank address BA_INT, and an error check operation is performed on the selected memory bank BK1, and a refresh operation is performed on the other memory banks BK0, BK2, and BK3.

The control signal generating circuit 250 may activate internal active signals ACT_INT<0:3> of the memory banks BK0 to BK3 in response to the activation of the refresh signal REF. Accordingly, an active operation of operation 411 of activating a row which is selected based on the internal row address R_ADD_INT in the selected memory bank BK1 may be performed, and an active operation of operation 421 of activating the selected row based on the internal row address R_ADD_INT in the other memory banks BK0, BK2, and BK3 may be performed. During the active operations, data of the memory cells in an active target row may be detected, amplified, and rewritten.

The control signal generating circuit 250 may activate the internal read signal RD_INT<1> of the selected memory bank BK1 after the activation of the internal active signals ACT_INT<0:3>. Accordingly, a read operation may be performed on the selected memory bank BK1 in operation 413. Data DATA' and the error correction code ECC may be read from the memory cells of the columns that are selected based on the internal column address C_ADD_INT in the activated row of the selected memory bank BK1, that is, the memory cells that are selected based on the internal row address R_ADD_INT and the internal column address C_ADD_INT, and an error in the data DATA' may be detected and corrected by the error correction circuit 261. When an error is detected by the error correction circuit 261, it may be logged in the error log circuit 270. Since the read operation performed during the error check operation is an operation for checking an error, the data DATA read and corrected from the selected memory bank BK1 may not be transferred to the memory controller 110.

The control signal generating circuit 250 may activate the internal precharge signals PCG_INT<0:3> of the memory banks BK0 to BK3 after the activation of the internal read signal RD_INT<1>. Accordingly, a precharge operation of precharging the row that is activated during the active operation of the operation 411 may be performed on the selected memory bank BK1 in operation 415, and a precharge operation of operation 425 of precharging the row that is activated during the active operation 421 may be performed on the other memory banks BK0, BK2, and BK3.

Figure 5:
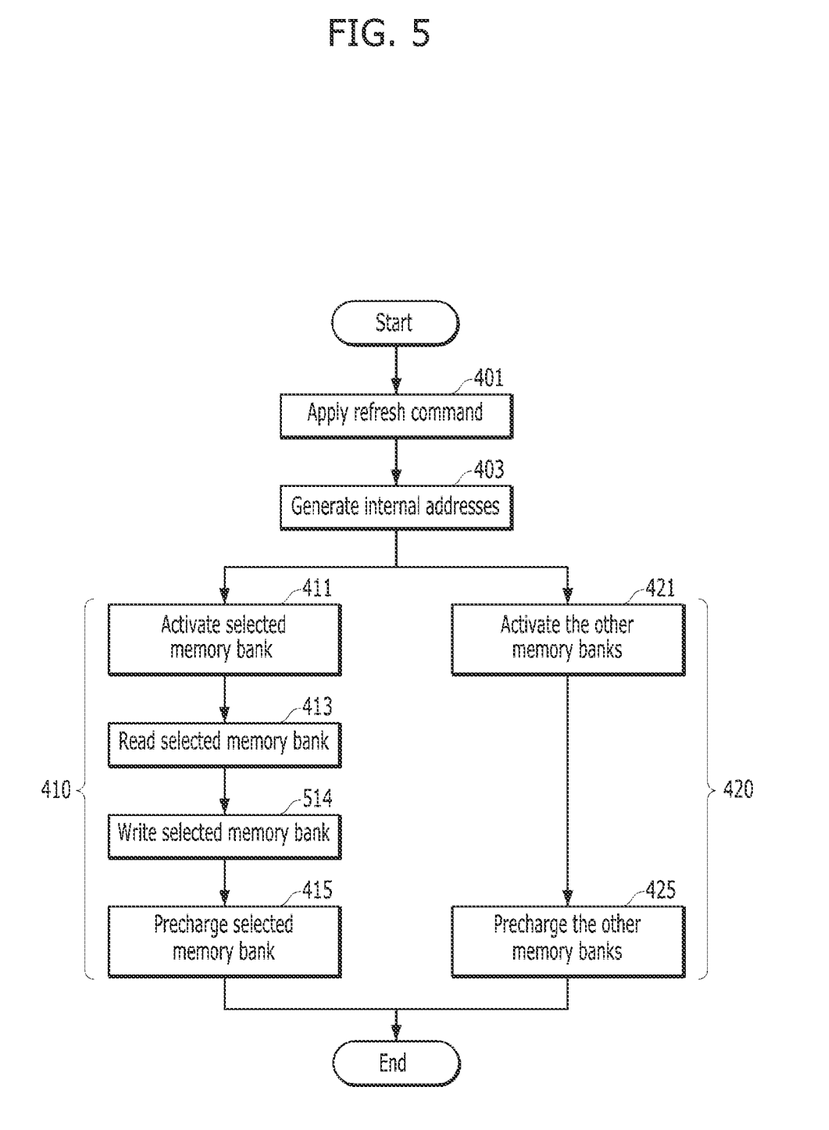
FIG. 5 is a flowchart describing of an operation of the memory system shown in FIG. 1 in accordance with another embodiment of the present invention.

FIG. 5 is a flowchart describing of an operation of the memory system 100 shown in FIG. 1 in accordance with another embodiment of the present invention. FIG. 4 illustrates a case where the error check operation includes an active operation, a read operation, and a precharge operation. However, FIG. 5 illustrates a case where the error check operation includes an active operation, a read operation, a write operation, and a precharge operation.

Referring to FIG. 5, it may be seen that a write operation of the operation 514 for the memory bank selected in the error check operation of the operation 410 is added, compared to what is shown in FIG. 4.

When the control signal generating circuit 250 activates the internal write signal of the selected memory bank BK1 after the activation of the internal read signal RD_INT<1> of the selected memory bank BK1, a write operation of the selected memory bank BK1 may be performed in the operation 514. The error correction code generating circuit 263 may newly generate an error correction code ECC based on the data whose error is corrected by the error correction circuit 261 during the read operation of the operation 413, and the data (DATA'=DATA) and the newly generated error correction code ECC may be written into the memory cells of the columns selected based on the internal column address C_ADD_INT in an activated row of the selected memory bank BK1. That is, the data (DATA'=DATA) whose error is corrected by the error correction circuit and the error correction code ECC newly generated by the error correction code generating circuit 263 may be written in the memory cells selected based on the internal row address R_ADD_INT and the internal column address C_ADD_INT in the selected memory bank BK1.

FIG. 5 describes that the write operation 514 is always included in the error check operation 410. However, when no errors are detected by the error correction circuit 261 during the read operation 413, there is no need to perform the write operation 514. Therefore, the write operation 514 may not be performed according to an embodiment of the present invention.

According to the above-described embodiments, when a refresh command is applied to the memory 120, an error check operation may be performed on one memory bank and a refresh operation may be performed on the other memory banks. Accordingly, as long as a refresh command is periodically applied from the memory controller 110 to the memory 120, a refresh operation and an error check operation required by the memory 120 may be periodically performed.

Although, it is illustrated in the above-described embodiments that the command for directing to perform an error check operation on one memory bank of the memory and to perform a refresh operation on the other memory banks is the refresh command, it would be apparent to those skilled in the art that the command directing the operations may be a newly defined command other than a refresh command.

According to the embodiment of the present invention, errors of a memory may be checked.

While the present invention has been described with respect to the specific embodiments, it will be apparent to those skilled in the art that various changes and modifications may be made without departing from the spirit and scope of the invention as defined in the following claims. Furthermore, the embodiments may be combined to form additional embodiments.

What is claimed is:

1. A method for operating a memory, the method comprising:
   receiving a predetermined command;
   performing an error check operation on a selected row and selected columns of one memory bank among a plurality of memory banks in response to the predetermined command; and
   performing a refresh operation on a selected row of each of the other memory banks among the memory banks in response to the predetermined command,
   wherein
   the performing of the error check operation for the one memory bank and the performing of the refresh operation for the other memory banks are simultaneously performed, and
   no error correction is performed on the other memory banks while the refresh operation is being performed on the other memory banks.

2. The method of claim 1, wherein the predetermined command includes a refresh command.

3. The method of claim 1, wherein the performing of the error check operation includes:
   activating the selected row of the one memory bank;
   reading data and an error correction code from memory cells of the selected columns in the selected row of the one memory bank;
   checking an error of the data by using the error correction code; and
   precharging the selected row of the one memory bank.

4. The method of claim 1, wherein the performing of the refresh operation includes:
   activating a selected row of each of the other memory banks; and
   precharging the selected row of each of the other memory banks.

5. The method of claim 1,
   further comprising generating an internal bank address, an internal row address, and an internal column address,
   wherein the performing of the error check operation includes:
   selecting the one memory bank based on the internal bank address; and
   selecting the row of the one memory bank based on the internal row address; and
   selecting the columns of the one memory bank based on the internal column address, and
   wherein the performing of the refresh operation includes selecting the row of each of the other memory banks based on the internal row address.

6. The method of claim 5, further comprising:
   changing the internal row address in response to the predetermined command;
   changing the internal column address whenever the internal row address is cycled once; and
   changing the internal bank address whenever the internal column address is cycled once.

7. The method of claim 5, further comprising:
   changing the internal row address in response to the predetermined command;
   changing the internal bank address whenever the internal row address is cycled once; and
   changing the internal column address whenever the internal bank address is cycled once.

8. The method of claim 1, wherein the selected row of the one memory bank during the error check operation is activated while the selected row of each of the other memory banks during the refresh operation is activated.

9. A memory comprising:
   a plurality of memory banks;
   an error correction circuit; and
   a control signal generating circuit suitable for generating, in response to a predetermined command, internal control signals to perform an error check operation in which the error correction circuit checks for an error in one memory bank among the memory banks, and to perform a refresh operation on the other memory banks among the memory banks,
   wherein
   the error check operation on the one memory bank is simultaneously performed with the refresh operation on the other memory banks, and
   no error correction is performed on the other memory banks while the refresh operation is being performed on the other memory banks.

10. The memory of claim 9, wherein the predetermined command includes a refresh command.

11. The memory of claim 9,
   further comprising an internal address generating circuit suitable for generating an internal bank address, an internal row address, and an internal column address,
   wherein the control signal generating circuit is further suitable for selecting the one memory bank based on the internal bank address among the memory banks, and
   wherein the control signal generating circuit generates the internal control signals to perform the error check operation on memory cells selected based on the internal row address and the internal column address in the one memory bank, and perform the refresh operation on a row selected based on the internal row address in each of the other memory banks.

12. The memory of claim 11, wherein the internal address generating circuit is further suitable for:
   changing the internal row address in response to the predetermined command,
   changing the internal column address whenever the internal row address is cycled once, and
   changing the internal bank address whenever the internal column address is cycled once.

13. The memory of claim 11, wherein the internal address generating circuit is further suitable for:
   changing the internal row address in response to the predetermined command, changing the internal bank address whenever the internal row address is cycled once, and changing the internal column address whenever the internal bank address is cycled once.

14. The memory of claim 11, wherein the control signal generating circuit generates the internal control signals by:
activating internal active signals of the memory banks in response to the predetermined command,
activating an internal read signal of the selected memory bank after activation of the internal active signals, and
activating internal precharge signals of the memory banks after activation of the internal read signal.

15. The memory of claim 9, further comprising an error log circuit suitable for logging the checked error.

16. A memory system comprising:
a memory including a plurality of memory banks and suitable for performing an error check operation on one memory bank among the memory banks and performing a refresh operation on the other memory banks among the memory banks, in response to application of a predetermined command, wherein the error check operation on the one memory bank is simultaneously performed with the refresh operation on the other memory banks, and no error correction is performed on the other memory banks while the refresh operation is being performed on the other memory banks; and
a memory controller suitable for controlling the memory and applying the predetermined command to the memory.

17. The memory system of claim 16, wherein the memory further includes:
an error correction circuit suitable for checking for an error during the error check operation; and
a control signal generating circuit suitable for generating internal control signals to perform the error check operation and the refresh operation in response to the predetermined command.

18. The memory system of claim 16, wherein the predetermined command is a refresh command.

19. The memory system of claim 17,
wherein the memory further includes an internal address generating circuit suitable for generating an internal bank address, an internal row address, and an internal column address,
wherein the control signal generating circuit is further suitable for selecting the one memory bank based on the internal bank address among the memory banks, and
wherein the control signal generating circuit generates the internal control signals to perform the error check operation on memory cells selected based on the internal row address and the internal column address in the one memory bank, and perform the refresh operation on a row selected based on the internal row address in each of the other memory banks.

20. The memory system of claim 19, wherein the internal address generating circuit is further suitable for:
changing the internal row address in response to the predetermined command,
changing the internal column address whenever the internal row address is cycled once, and
changing the internal bank address whenever the internal column address is cycled once.

21. The memory system of claim 19, wherein the internal address generating circuit is further suitable for:
changing the internal row address in response to the predetermined command,
changing the internal bank address whenever the internal row address is cycled once, and
changing the internal column address whenever the internal bank address is cycled once.

22. The memory system of claim 19, wherein the control signal generating circuit generates the internal control signals by: activating internal active signals of the memory banks in response to the predetermined command,
activating an internal read signal of the selected memory bank after activation of the internal active signals, and
activating internal precharge signals of the memory banks after activation of the internal read signal.

23. The memory system of claim 17, wherein the memory further includes an error log circuit suitable for logging the checked error, and transferring, in response to an error information request of the memory controller, information of the logged error to the memory controller.

24. An operating method of a memory including first and second banks each having memory cells of rows and columns, the operating method comprising:
performing first and second operations in response to a command for the first operation,
wherein the first operation includes activating and precharging a first row of the first bank, and
wherein the second operation includes:
activating a second row of the second bank while activating the first row of the first bank;
detecting an error of data read from the second row and logging the error from the second row in an error log circuit; and
after detecting the error in the second row, precharging the second row of the second bank while precharging the first row of the first bank.

* * * * *